United States Patent

Gans et al.

[11] Patent Number: 5,905,682
[45] Date of Patent: May 18, 1999

[54] METHOD AND APPARATUS FOR BIASING THE SUBSTRATE OF AN INTEGRATED CIRCUIT TO AN EXTERNALLY ADJUSTABLE VOLTAGE

[75] Inventors: Dean D. Gans; John R. Wilford, both of Boise, Id.

[73] Assignee: Micron Technology, Inc., Boise, Id.

[21] Appl. No.: 08/921,863

[22] Filed: Aug. 22, 1997

[51] Int. Cl.$^6$ .................................................. G11C 7/00
[52] U.S. Cl. ................ 365/201; 365/189.09; 365/189.11
[58] Field of Search .............................. 365/201, 189.09, 365/189.11; 327/534, 536

[56] References Cited

U.S. PATENT DOCUMENTS

| | | | |
|---|---|---|---|
| 4,825,142 | 4/1989 | Wang | 327/534 |
| 5,079,744 | 1/1992 | Tobita et al. | 365/201 |
| 5,119,337 | 6/1992 | Shimizu et al. | 365/201 |
| 5,212,442 | 5/1993 | O'Toole et al. | 324/158 R |
| 5,276,646 | 1/1994 | Kim et al. | 365/189.09 |
| 5,574,691 | 11/1996 | Tanida et al. | 365/201 |
| 5,619,459 | 4/1997 | Gilliam | 365/201 |

OTHER PUBLICATIONS

Micron Semiconductor, Inc., Schematic of Circuit used in DRAMs since before Aug. 15, 1995. (single schematic, 2 pages).

Primary Examiner—Huan Hoang
Attorney, Agent, or Firm—Seed and Berry LLP

[57] ABSTRACT

A substrate biasing circuit operates in either a test mode or a normal operating mode. The substrate biasing circuit includes a voltage generating circuit generating a substrate biasing voltage at an output terminal and a control terminal controlling the magnitude of the substrate voltage. When the voltage at the control terminal is more positive than a predetermined value, the voltage generating circuit gradually drives the substrate more negative. When the voltage at the control input of the voltage generating circuit is less than the predetermined value, the output terminal of the voltage generating circuit essentially floats. In normal operation, the output terminal of the voltage generating circuit is also coupled to the control terminal so that the substrate voltage is regulated at the predetermined negative voltage. Alternatively, the substrate may be coupled to ground and the voltage generating circuit disabled during normal operation. In a test mode, the control terminal is coupled to an externally accessible input terminal. Respective impedance elements between the control terminal and the input terminal and between the control terminal and the output terminal form a voltage divider. As a result, the substrate voltage is adjusted as a function of a voltage applied to the input terminal to maintain the control terminal of the voltage generating circuit at the predetermined value. The control terminal may be coupled to the input terminal through a pass gate which may be controlled by a decode circuit to selectively isolate the control terminal from the externally accessible input terminal during normal operation.

40 Claims, 4 Drawing Sheets

5,905,682

METHOD AND APPARATUS FOR BIASING THE SUBSTRATE OF AN INTEGRATED CIRCUIT TO AN EXTERNALLY ADJUSTABLE VOLTAGE

TECHNICAL FIELD

This invention relates to test circuits for integrated circuits, and, more particularly, to a circuit for biasing the substrate of an integrated circuit to an externally adjustable test voltage.

BACKGROUND OF THE INVENTION

Integrated circuits include a large number of transistors formed on a semiconductor substrate, such as silicon. The transistors may be a variety of types such as NMOS and PMOS transistors. Examples of integrated circuits of this type are memory devices such as static random access memories ("SRAMs") and dynamic random access memories ("DRAMs"). Further, there are several varieties of DRAMs such as synchronous DRAMs ("SDRAMs") and packetized DRAMs.

It is common in integrated circuits, particular integrated circuit memory devices, for the substrate of the integrated circuit to be biased at ground potential. However, it is also common for the substrate to be biased to a negative voltage. Biasing the substrate of the integrated circuit at a negative voltage lowers the sensitivity of threshold voltages to a phenomenon known as the "body effect," increases punch-through voltages, lowers the diffusion-to-substrate capacitance and provide other advantages. For example, a negative substrate voltage lowers subthreshold leakage on clocked depletion transistors and protects the chip against forward biasing of the substrate due to voltage undershoots at the inputs of the integrated circuit. The negative voltage is typically provided by a negative bias voltage generator, such as a charge pump. A wide variety of conventional charge pumps may be used for this purpose, one of which is illustrated in FIG. 1 to bias the substrate of an integrated circuit memory device 10. The memory device 10 includes conventional memory circuits 12 that are formed by a large number of transistors fabricated on the substrate of the memory device 10. The memory circuits 12 are coupled to external devices through a bus system 14 such as an address bus, a data bus, and a control/status bus.

Also fabricated on the substrate of the integrated circuit memory device 10 is a negative voltage generator 20 having an output voltage line 26 and a control voltage input line 28. The output voltage line 26 is coupled to the substrate of the memory device 10 to apply a substrate bias voltage Vbb to the substrate. The input control line 28 is also coupled to the substrate to apply the substrate voltage Vbb to a control input of the negative voltage generator 20. In operation, the magnitude of the voltage generated by the negative voltage generator 20 is controlled by the input control voltage on line 28 to regulate the bias voltage Vbb to a predetermined value. When the bias voltage Vbb tends to decrease for various reasons, such as an increase in load, the reduced bias voltage Vbb coupled to the input control line 28 causes the negative voltage generator 20 to bring the bias voltage Vbb back to the predetermined voltage. Negative voltage generators 20 having the characteristics described above are conventional and are described in, for example, U.S. Pat. No. 5,574,691 which is incorporated herein by reference.

Commercially available integrated circuits, such as memory devices, are typically tested throughout and after their manufacturing process. Generally, these integrated circuits are initially tested while they are still in wafer form before being separated to individual integrated circuit dies. Final testing of the integrated circuit occurs after the integrated circuit die has been placed in a package having externally accessible contacts. In the testing of integrated circuits, it is generally desirable to test under conditions in which the integrated circuit is more likely to fail compared to normal operating conditions. For example, for integrated circuits having a grounded substrate, it is desirable to test the integrated circuit with the substrate at a negative voltage. For integrated circuits having a substrate that is biased to a negative voltage during normal operation, it is desirable to test the integrated circuit with the substrate at a voltage that is more negative than the normal substrate bias voltage. If the integrated circuit operates properly at this test voltage, then it is more likely to work properly at the voltage to which the substrate is biased during normal operating conditions.

A variety of techniques have been used to provide a substrate voltage for test purposes. For example, as illustrated in FIG. 2, an integrated circuit, such as a memory device 30 having memory circuits 12, includes an enable circuit 32 having an externally accessible input terminal 34. The memory device 30 also includes a negative voltage generator 36 having an enable input terminal 38 connected to an output terminal 40 of the enable circuit 32. The negative voltage generator 36 has an output terminal 42 coupled to the substrate of the memory device 30. When enabled, the negative voltage generator 36 outputs a negative test voltage $V_{TEST}$ that is more negative than the substrate voltage Vbb produced by a different negative voltage generator (not shown in FIG. 2).

In operation, one or more signals are applied through one or more input lines 34 to the enable circuit 32, thereby causing the enable circuit 32 to generate an enable signal. The enable signal is applied to the enable input terminal of the negative voltage generator 36 which then generates the test voltage $V_{TEST}$. Since the test voltage $V_{TEST}$ is more negative than the normal bias voltage Vbb, some tests performed on the memory circuits 12 in this condition may be more likely to fail as compared to normal operation. Thus, testing using the enable circuit 32 and negative voltage generator 36 of FIG. 2 is more likely to discover faults in the memory circuits 12 during testing.

Although the approach shown in FIG. 2 can successfully bias the substrate of the integrated circuit 30 to a negative test voltage that is more negative than the normal substrate voltage Vbb, it requires the inclusion of a negative voltage generator 36 for integrated circuits having a normally grounded substrate or a second negative voltage generator 36 for integrated circuits having a normally negatively biased substrate. The need to fabricate a negative voltage generator 36 or an additional negative voltage generator 36 in the memory device 30 increases the cost of the memory device 30 or other integrated circuit and can consume a significant quantity of surface area. Increasing the cost, complexity, and size of a memory device 30 solely for the purpose of facilitating factory testing is considered undesirable since this additional circuitry is used only briefly during the life of the integrated circuit. Furthermore, although the negative voltage generator 36 can generate a suitable test voltage $V_{TEST}$, the magnitude of the test voltage $V_{TEST}$ cannot be varied. However, it is often desirable to vary the test voltage to alter the severity of the test depending on a variety of factors.

One technique for applying a negative test voltage to a substrate in integrated circuits having an existing negative voltage generator is described in U.S. Pat. No. 5,619,459 to Gilliam. The Gilliam patent teaches continuously activating a negative voltage substrate pump during testing, and then regulating the substrate voltage to a predetermined value using a voltage sensitive shunt. However, this shunt regulator approach may use excessive current for many applications. Furthermore, a significant amount of circuitry is required to implement the shunt regulator and the control circuitry for the regulator and charge pump.

The above-described disadvantages of the approaches described above can be eliminated by simply coupling a test voltage to the substrate of an integrated circuit the integrated circuit from an external source, as illustrated in FIG. 3. As shown in FIG. 3, an integrated circuit, such as a memory device 52 containing memory circuits 12, has a pair of externally accessible input terminals 54, 56. The input terminal 56 controls the conductive state of a pass gate 58 which selectively couples the input terminal 54 to the substrate.

In operation, a negative test voltage is applied to the input terminal 54 which is then selectively coupled to the substrate by the pass gate 58. The technique shown in FIG. 3 avoids the disadvantages of FIG. 2 since the magnitude of the test voltage $V_{TEST}$ can be varied at will and only a negligible amount of additional circuitry is required, i.e., the circuitry in the pass gate 58. However, the technique shown in FIG. 3 has the disadvantage of allowing the substrate to be inadvertently coupled to an external pin which may be at a voltage that can damage the integrated circuit 52. Furthermore, it is often not possible to couple a large negative voltage from an external terminal to the substrate without forward biasing semiconductor junctions that are also coupled to the input terminal 54.

There is therefore a need for a technique to apply to the substrate a negative test voltage that has an externally adjustable magnitude without requiring the addition of significant circuitry or risking the forward biasing of semiconductor junctions.

SUMMARY OF THE INVENTION

In accordance with one aspect of the invention, a substrate biasing circuit includes a voltage generating circuit for applying an externally controlled test voltage to the substrate of an integrated circuit during a test mode. The voltage generating circuit has a control input and an output terminal coupled to a substrate of the integrated circuit. The voltage generating circuit generates an output voltage at its output terminal that increases in magnitude in one polarity responsive to a control voltage applied to the control input being within a predetermined range. The output voltage generated by the voltage generating circuit is preferably negative but it may also be positive. The substrate biasing circuit also includes a first impedance element coupled between the output terminal and the control input of the voltage generating circuit. The control input of the voltage generating circuit is also coupled to an externally accessible input terminal. As a result, the voltage generating circuit biases the substrate of the integrated circuit to a voltage that causes the voltage at the control terminal of the voltage generating circuit to be near or within the predetermined range. Since the voltage at the control terminal of the voltage generating circuit is a function of both the substrate voltage and a voltage applied to the input terminal of the integrated circuit, the voltage of the substrate can be controlled by the voltage applied to the input terminal of the integrated circuit during testing of the integrated circuit. During normal operation, the control terminal of the voltage generating circuit may be isolated from the input terminal so that the operation of the voltage generating circuit is controlled only by the substrate voltage. The externally accessible input terminal is preferably coupled to the control input of the voltage generating circuit through a second impedance element so that the first and second impedance elements form a voltage divider. However, the second impedance element can be omitted, and the output impedance of a voltage source that is used to supply a voltage to the input terminal may form a voltage divider with the first impedance element. The input terminal may be selectively coupled to the control input of the voltage generating circuit through a pass gate. The conductive state of the pass gate is preferably controlled by a test mode enable circuit having at least one externally accessible terminal and an output terminal coupled to a control terminal of the pass gate. The test mode enable circuit controls the pass gate responsive to an input signal applied to the externally accessible terminal of the test mode enable circuit.

DETAILED DESCRIPTION OF THE INVENTION

Figure 1:
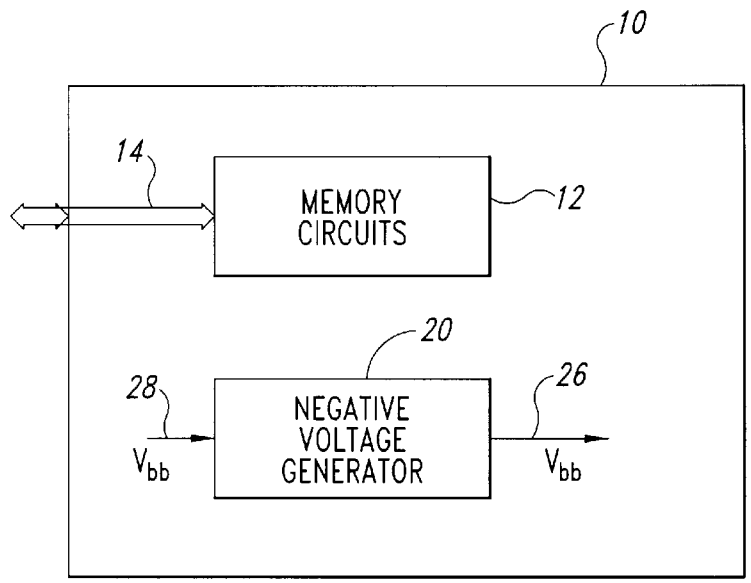
FIG. 1 is a block diagram of a prior art integrated circuit having means for biasing its substrate to a negative voltage during normal operation.
Figure 2:
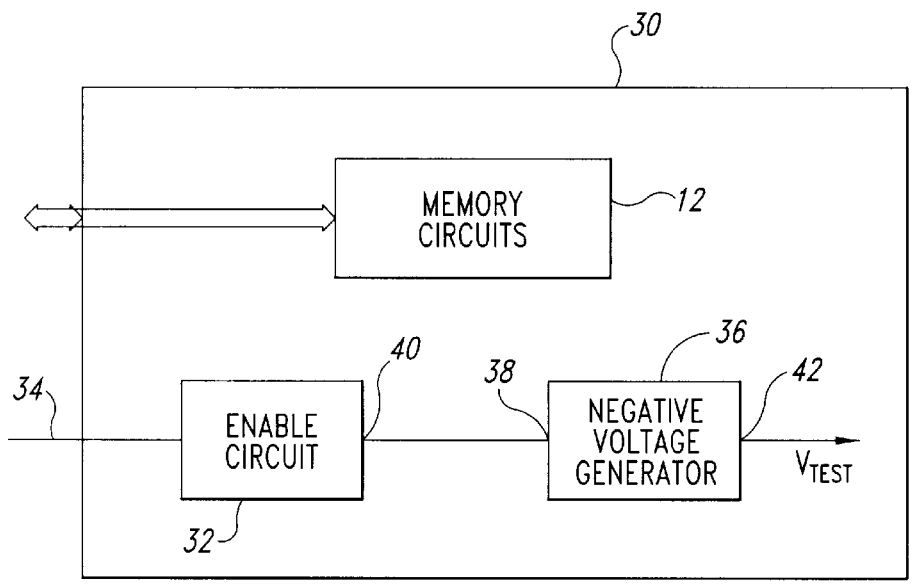
FIG. 2 is a block diagram of a prior art integrated circuit having means for biasing its substrate to a negative test voltage during production testing of the integrated circuit.
Figure 3:
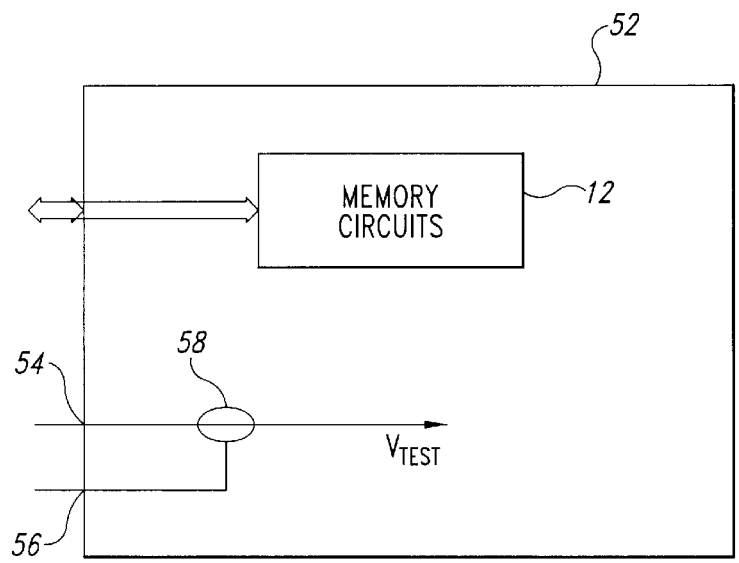
FIG. 3 is a block diagram of a prior art integrated circuit having an alternative means for biasing its substrate to a negative test voltage during production testing of the integrated circuit.
Figure 4:
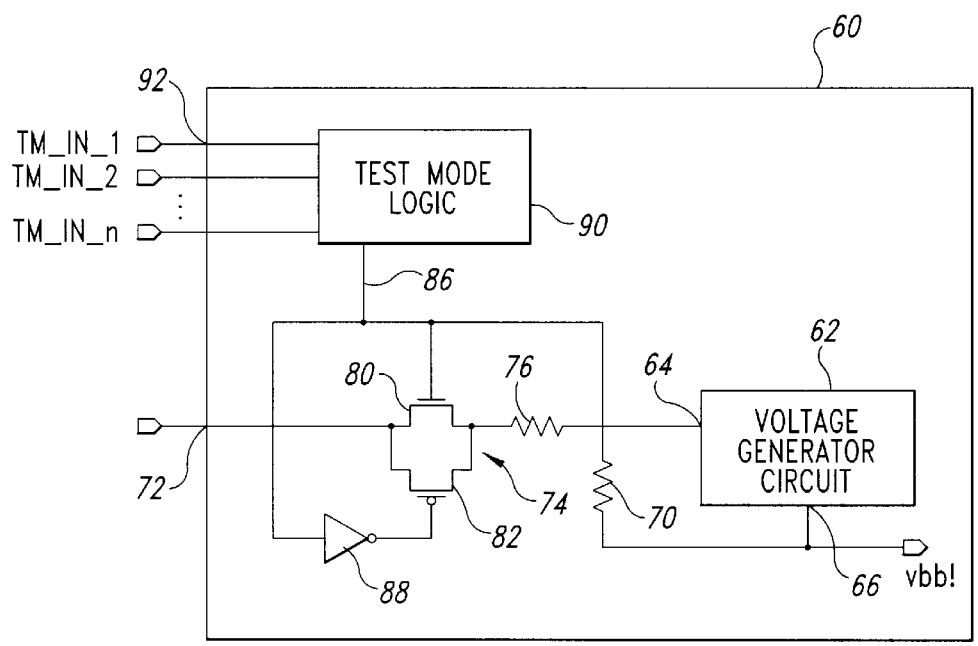
FIG. 4 is a block diagram of one embodiment of an integrated circuit having a circuit for biasing its substrate to a negative test voltage according to the present invention.

A preferred embodiment of a substrate biasing circuit 60 in accordance with the invention is illustrated in FIG. 4. The substrate biasing circuit 60 includes a voltage generator 62, such as a charge pump, that has a control terminal 64 and an output terminal 66. The voltage generating circuit may be either an existing voltage generating circuit used to normally bias the substrate to a negative voltage or a negative voltage generator provided for the purpose of supplying a negative test voltage. The voltage generating circuit 62 generates an output voltage, preferably a negative voltage, at the output terminal 66 which increases toward one polarity when a control voltage OSCEN applied to the control terminal 64 is within a predetermined range. For the embodiment of the substrate biasing circuit 60 illustrated in FIG. 4, the voltage generating circuit 62 generates a voltage that gradually becomes more negative whenever the control voltage OSCEN applied to the control terminal 64 is more positive than a predetermined positive voltage, such as 1 volt. Whenever the control voltage OSCEN applied to the control terminal 64 is less than 1 volt, the output terminal 66 of the voltage generating circuit 62 essentially floats. The voltage generating circuit 62 having the characteristics described above is conventional and is normally implemented as a charge pump.

The output terminal 66 of the voltage generating circuit 62 is coupled to both the substrate of an integrated circuit on which the voltage generating circuit 62 is fabricated and the control terminal 64 through an impedance element 70 such as a resistor. The control terminal 64 is also coupled to an externally accessible input terminal 72 through a pass gate 74 and a second impedance element, such as a resistor 76. The pass gate 74 is formed by an NMOS transistor 80 and a PMOS transistor 82 connected in parallel. The conductive state of the pass gate 74 is controlled by an enable signal on line 86 which is applied to the gates of the transistors 80, 82 either directly in the case of the NMOS transistor 80 or through an inverter 88 in the case of the PMOS transistor 82. The enable signal on line 86 is selectively generated by a test mode logic circuit 90 from signals applied to a plurality of externally accessible terminals as further described below.

During normal operation, the pass gate 74 is nonconductive so that the voltage at the control input 64 of the voltage generating circuit 62 is controlled entirely by the substrate voltage Vbb. Thus, when the substrate voltage is less negative than, for example, 1 volt, the voltage generating circuit 62 generates an increasingly negative voltage until the substrate voltage is more negative than 1 volt. When the substrate voltage is more negative than 1 volt, the output terminal 66 essentially floats, thereby allowing the substrate voltage to gradually become less negative as other circuitry in the integrated circuit (not shown) leaks current to the substrate. Thus, in normal operation, the output voltage at the output terminal 66 oscillates around a predetermined voltage, i.e., one of the voltages in the range of voltages at which the voltage at the output of the voltage generating circuit 62 becomes increasingly negative.

Figure 5A:
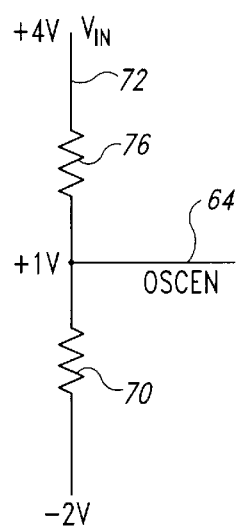
FIGS. 5A and 5B are schematics showing two different conditions of a portion of the substrate biasing circuit of FIG. 4.
Figure 5B:
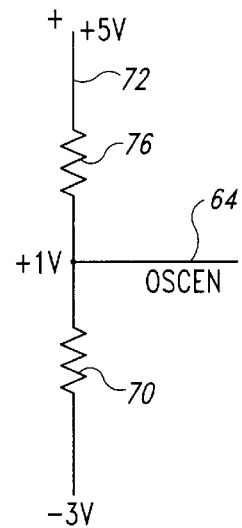

During a test mode of operation, the test mode logic circuit 90 outputs a high enable signal on line 86, thereby making the pass gate 74 conductive. The conductive pass gate 74 then couples the externally accessible input terminal 72 to the control terminal 64 of the voltage generating circuit 62 through the impedance element 76. In this configuration, the circuitry coupled to the control terminal 64 forms a voltage divider as illustrated in FIG. 5A. By way of example, it will be assumed that the resistance of the impedance element 70 is half the resistance of the impedance element 76. It will also be assumed that the voltage generating circuit will generate a voltage causing the control voltage OSCEN to be at +1 volt. Under these circumstances, when a voltage of +4 volts is applied to the externally accessible input terminal 72, the voltage generating circuit 62 will generate a −2 volts output signal at the output terminal 66 so that the control voltage OSCEN will be +1 volt. Similarly, as illustrated in FIG. 5B, when the voltage applied to the externally accessible input terminal 72 is +5 volts, the voltage generating circuit 62 will drive the substrate to −3 volts so that the control voltage applied to the control terminal 64 remains at +1 volt. Thus, the substrate biasing circuit 60 illustrated in FIG. 4 drives the substrate of the integrated circuit to a negative test voltage that is controlled by an externally generated positive voltage. It is therefore not necessary to couple a negative voltage to the substrate from an external source. Further, the voltage generating circuit 66 can be used to bias the substrate to a negative voltage in a normal manner after production testing has been completed.

Returning now, to FIG. 4, the test mode logic circuit 90 can be a conventional decode circuit that detects a predetermined combination of signals applied to externally accessible terminals 92 of the integrated circuit. The externally accessible terminals 92 can be any terminals of an integrated circuit in which the predetermined combination of signals are not normally applied during operation. Applying the predetermined combination of signals to the externally accessible terminals 92 causes the test mode logic circuit 90 to generate a high enable signal on line 86. As explained above, the high enable signal on line 86 makes the pass gate 74 conductive, thereby allowing an externally generated control signal to be coupled from input terminal 72 to the control terminal 64 of the voltage generating circuit 62.

Although the substrate biasing circuit 60 shown in FIG. 4 uses a second impedance element 76 to form a voltage divider as illustrated in FIGS. 5A and 5B, the impedance element 76 may be omitted under some circumstances. For example, the device furnishing the control signal to the externally accessible input terminal 72 will normally have some output impedance, and this output impedance will form a voltage divider with the first impedance element 70. Also, although the pass gate 74 is generally desired to allow the control terminal 64 to be isolated from the externally accessible input terminal 72 during normal operation, it is possible to couple the control terminal 64 directly to the input terminal 72 and may be desirable to do so under some circumstances.

Figure 6:
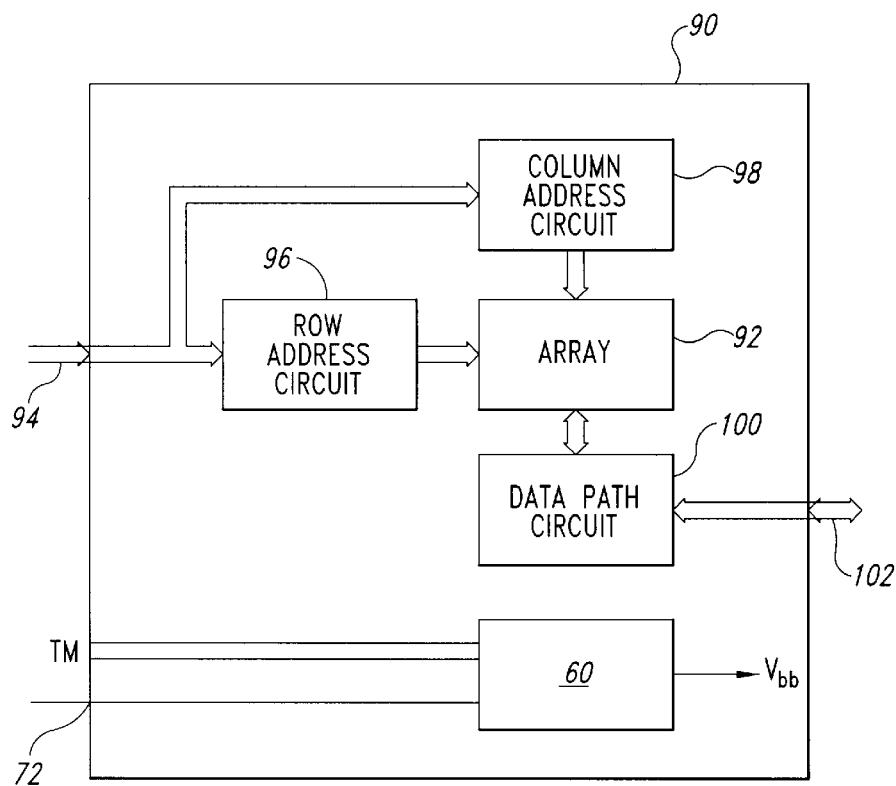
FIG. 6 is a block diagram of a memory device using the substrate biasing circuit of FIG. 4.

The substrate biasing circuits 60 may be used in a memory device 90 as shown in FIG. 6. The memory device 90 may be a dynamic random access memory ("DRAM"), a static random access memory ("SRAM") or any other type of memory device. As shown in FIG. 6, the memory device 90 is a 5 DRAM having an array 92 of memory cells arranges in rows and columns. The memory device 90 is coupled to an address bus 94 which applies a row address to a row address circuit 96 and a column address to a column address circuit 98. The row address circuit 96 and the column address circuit 98 are coupled to the array 92 to select a memory cell at the row and column corresponding to the row address and the column address. The memory cell is then coupled through a data path circuit 100 to a data bus 102. In normal operation, the substrate biasing circuit 60 biases the substrate of the memory device 90 to a predetermined voltage, such as ground or a negative voltage, eg., −1 volt. However, during testing, a predetermined combination of signals are applied to the TM inputs of the substrate biasing circuit 60, thereby coupling the input terminal 72 to the voltage generating circuit 62 (FIG. 4). Also, in the event the substrate is coupled to ground in normal operation through a switch (not shown), a signal from the test mode logic circuit 90 may cause the switch to decouple the substrate from ground before the negative voltage is applied to the substrate for test purposes. The substrate biasing circuit 60 then applies a negative test voltage to the substrate of the memory device 90 having a magnitude determined by the magnitude of the voltage applied to the input terminal 72, as explained above.

Figure 7:
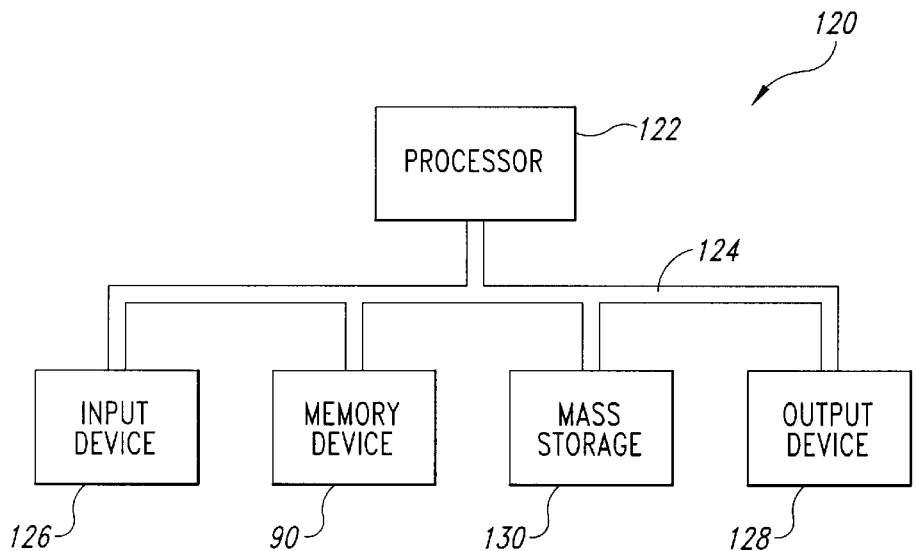
FIG. 7 is a block diagram of a computer system using the memory device of FIG. 6.

The memory device may be used in a computer system of the type illustrated in FIG. 7. The computer system 120 includes a processor 122 coupled to the memory device 90 through a bus system 124 generally formed by a plurality of buses. The processor 122 is also coupled to an input device 126, such as a keyboard or pointing device, to provide input signals to the computer system 120. The processor 122 is also coupled through the bus system 124 to an output device 128 such as a video display. Finally, the processor 122 is coupled through the bus system 124 to a mass storage device 130, such as a hard disk drive, to nonvolatilely store instructions and data. Other devices may, of course, be coupled to the processor 122 or other components without departing from the spirit of the invention.

Figure 8:
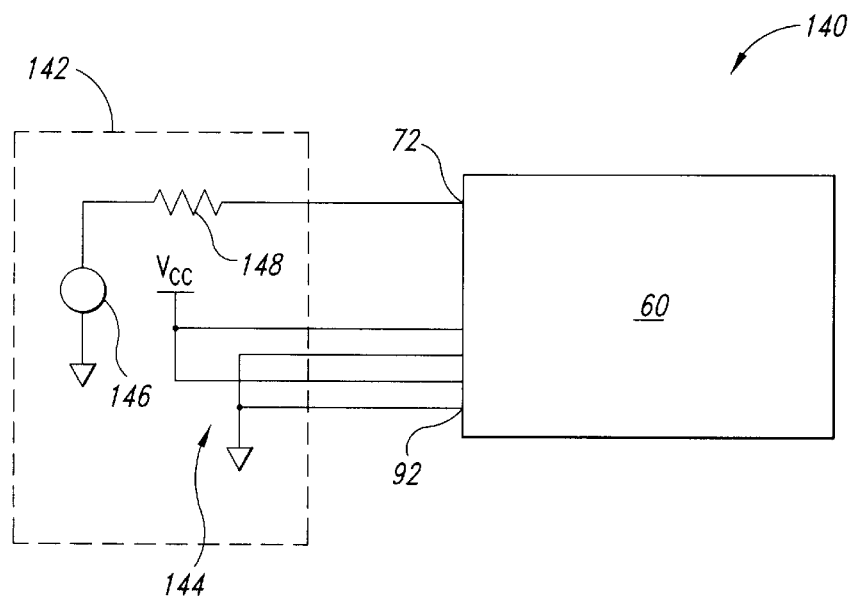
FIG. 8 is a block diagram of a testing system using the substrate biasing circuit of FIG. 4.

As illustrated in FIG. 8, the substrate biasing circuit 60 may be used in a test system 140 in combination with a testing device 142. The testing device 142 includes a code generator 144 to apply a predetermined pattern of signals to the substrate biasing circuit 60. This predetermined pattern of signals is decoded by the test mode logic circuit 90 (FIG. 4) to produce a high enable signal to couple the input terminal 72 to the voltage generating circuit 62. In the embodiment illustrated in FIG. 8, the code generating circuit 144 drives bits 0 and 2 to logic "0" and bits 1 and 3 to logic "1." The testing device 142 also includes a voltage source 146 which is coupled to the input terminal 72 through an output impedance 148. The output impedance 148 forms a voltage divider with the first impedance element 70 either alone or with the second impedance element 76 as explained above. After the testing device 142 places the substrate biasing circuit 60 in the test mode, a plurality of conventional tests may be performed on the memory device 90 by conventional testing equipment (not shown).

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

We claim:

1. A substrate biasing circuit for biasing the substrate of an integrated circuit to a test voltage having a magnitude that is adjustable by an externally applied voltage that may have a polarity opposite the polarity of the test voltage, the substrate biasing circuit comprising:
   a voltage generating circuit having a control input and an output terminal coupled to a substrate of the integrated circuit, the voltage generating circuit generating an output voltage at the output terminal that increases in magnitude in one polarity responsive to a control voltage applied to the control input being within a predetermined range;
   a first impedance element coupled between the output terminal and the control input of the voltage generating circuit;
   an externally accessible input terminal coupled to the control input of the voltage generating circuit;
   a pass gate positioned between the externally accessible input terminal and the control input of the voltage generating circuit, the pass gate coupling the control input of the voltage generating circuit to the externally accessible input terminal responsive to an enable signal applied to a control input of the pass gate, the pass gate isolating the control input of the voltage generating circuit from the externally accessible input terminal responsive to a disable signal applied to the control input of the pass gate; and
   a test mode enable circuit having at least one externally accessible terminal and an output terminal coupled to the control input of the pass gate, the test mode enable circuit generating the enable signal responsive to a predetermined input signal applied to the externally accessible terminal of the test mode enable circuit and generating the disable signal responsive to the predetermined input signal not being applied to each externally accessible terminal of the test mode enable circuit.

2. The substrate biasing circuit of claim 1 wherein the test mode enable circuit includes a plurality of externally accessible input terminals, and wherein the test mode enable circuit comprises a decoder generating the enable signal responsive to a predetermined combination of respective signals applied to the plurality of externally accessible terminals of the test mode enable circuit.

3. A substrate biasing circuit for biasing the substrate of an integrated circuit to either a constant negative voltage or a test voltage having a magnitude that is adjustable by an externally applied input voltage, the substrate biasing circuit comprising:
   a negative voltage generating circuit having a control input and an output terminal coupled to a substrate of the integrated circuit, the voltage generating circuit generating at the output terminal a negative voltage that becomes more negative responsive to a control voltage applied to the control input being less negative than a predetermined negative set voltage;
   a feedback conductor coupling the output terminal to the control input of the voltage generating circuit;
   an externally accessible input terminal; and
   a pass gate coupling the externally accessible input terminal to the control input of the voltage generating circuit responsive to an enable signal applied to a control input of the pass gate, the pass gate being adapted to couple to a positive voltage applied to the input terminal to the control input of the voltage generating circuit.

4. A substrate biasing circuit for biasing the substrate of an integrated circuit to either a constant negative voltage or a test voltage having a magnitude that is adjustable by an externally applied input voltage, the substrate biasing circuit comprising:
   a negative voltage generating circuit having a control input and an output terminal coupled to a substrate of the integrated circuit, the voltage generating circuit generating at the output terminal a negative voltage that becomes more negative responsive to a control voltage applied to the control input being less negative than a predetermined negative set voltage;
   a feedback conductor coupling the output terminal to the control input of the voltage generating circuit;
   an externally accessible input terminal;
   a pass gate coupling the externally accessible input terminal to the control input of the voltage generating circuit responsive to an enable signal applied to a control input of the pass gate; and
   a test mode enable circuit having at least one externally accessible input terminal and an output terminal coupled to the control terminal of the pass gate, the test mode enable circuit generating the enable signal responsive to a predetermined input signal applied to an externally accessible terminal of the test mode enable circuit.

5. The substrate biasing circuit of claim 4 wherein the test mode enable circuit includes a plurality of externally accessible input terminals, and wherein the test mode enable circuit comprises a decoder generating the enable signal responsive to a predetermined combination of respective signals applied to the input terminals of the test mode enable circuit.

6. A voltage generating circuit for biasing the substrate of an integrated circuit to a test voltage having a magnitude that is adjustable by an externally applied voltage that may have a polarity opposite the polarity of the test voltage, the voltage generating circuit comprising:

charge pump means for applying a bias voltage to the substrate of the integrated circuit that increases in magnitude in one polarity responsive to a control voltage applied to a control input of the voltage generating circuit means within a predetermined range;

coupling means for coupling the substrate of the integrated circuit to the control input of the charge pump means;

an externally accessible input terminal coupled to the control input of the voltage charge pump means;

pass gate means for selectively coupling the externally accessible input terminal to the control input of the charge pump means responsive to an enable signal applied to a control input of the pass gate means; and test mode enable means having at least one externally accessible input terminal for applying the enable signal to the control input of the pass gate means responsive to a predetermined input signal applied to the externally accessible input terminal of the test mode enable means.

7. The voltage generating circuit of claim 6 wherein the test mode enable means includes a plurality of externally accessible terminals, and wherein the test mode enable means comprises decoder means generating the enable signal responsive to a predetermined combination of respective signals applied to the plurality of externally accessible terminals of the test mode enable means.

8. A memory device formed on an integrated circuit substrate, comprising at least one array of memory cells adapted to store data at a location determined by a row address and a column address;

a row address circuit adapted to receive and decode the row address, and select a row of memory cells corresponding to the row address;

a column address circuit adapted to receive or apply data to one of the memory cells in the selected row corresponding to the column address;

a data path circuit adapted to couple data between an external terminal and the column address circuit; and a substrate biasing circuit for biasing the substrate of the integrated circuit to a test voltage having a magnitude that is adjustable by an externally applied voltage that may have a polarity opposite the polarity of the test voltage, the voltage generating circuit comprising:

a voltage generating circuit having a control input and an output terminal coupled to a substrate of the integrated circuit, the voltage generating circuit generating an output voltage at the output terminal that increases in magnitude in one polarity responsive to a control voltage applied to the control input being within a predetermined range;

a first impedance element coupled between the output terminal and the control input of the voltage generating circuit; and an externally accessible input terminal coupled to the control input of the voltage generating circuit.

9. The memory device of claim 8 wherein the externally accessible input terminal is coupled to the control input of the voltage generating circuit through a second impedance element.

10. The memory device of claim 8 wherein the voltage generating circuit comprises a charge pump.

11. The memory device of claim 8 wherein the voltage generating circuit comprises a voltage generating circuit generating a negative voltage.

12. The memory device of claim 8 wherein the voltage generating circuit comprises a voltage generator that is used to bias the substrate to a negative bias voltage during normal operation.

13. The memory device of claim 8, further comprising a pass gate positioned between the externally accessible input terminal and the control input of the voltage generating circuit, the pass gate coupling the control input of the voltage generating circuit to the externally accessible terminal responsive to an enable signal applied to a control input of the pass gate, the pass gate isolating the control input of the voltage generating circuit from the externally accessible input terminal responsive to a disable signal applied to a control input of the pass gate.

14. The memory device of claim 13, further comprising a test mode enable circuit having at least one externally accessible terminal and an output terminal coupled to the control terminal of the pass gate, the test mode enable circuit generating the enable signal responsive to a predetermined input signal applied to the externally accessible terminal of the test mode enable circuit and generating the disable signal responsive to the predetermined input signal not being applied to each externally accessible input terminal.

15. The memory device of claim 14 wherein the test mode enable circuit includes a plurality of externally accessible terminals, and wherein the test mode enable circuit comprises a decoder generating the enable signal responsive to a predetermined combination of respective signals applied to the plurality of externally accessible terminals of the test mode enable circuit.

16. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory device formed on an integrated circuit substrate, the memory device being coupled to the processor through the processor bus, the memory device comprising:

at least one array of memory cells adapted to store data at a location determined by a row address and a column address;

a row address circuit adapted to receive and decode the row address, and select a row of memory cells corresponding to the row address;

a column address circuit adapted to receive or apply data to one of the memory cells in the selected row corresponding to the column address;

a data path circuit adapted to couple data between an external terminal and the column address circuit; and a substrate biasing circuit for biasing the substrate of the integrated circuit to a test voltage having a magnitude that is adjustable by an externally applied voltage that may have a polarity opposite the polarity of the test voltage, the substrate biasing circuit comprising:

a voltage generating circuit having a control input and an output terminal coupled to a substrate of the integrated circuit, the voltage generating circuit generating an output voltage at the output terminal that increases in magnitude in one polarity responsive to a control voltage applied to the control input being within a predetermined range;

a first impedance element coupled between the output terminal and the control input of the voltage generating circuit; and an externally accessible input terminal coupled to the control input of the voltage generating circuit.

17. The computer system of claim 16 wherein the externally accessible input terminal is coupled to the control input of the voltage generating circuit through a second impedance element.

18. The computer system of claim 16 wherein the voltage generating circuit comprises a voltage generator that is used to bias the substrate to a negative bias voltage during normal operation.

19. The computer system of claim 16, further comprising a pass gate positioned between the externally accessible input terminal and the control input of the voltage generating circuit, the pass gate coupling the control input of the voltage generating circuit to the externally accessible input terminal responsive to an enable signal applied to a control input of the pass gate, the pass gate isolating the control input of the voltage generating circuit from the externally accessible input terminal responsive to a disable signal applied to a control input of the pass gate.

20. The computer system of claim 19, further comprising a test mode enable circuit having at least one externally accessible terminal and an output terminal coupled to the control terminal of the pass gate, the test mode enable circuit generating the enable signal responsive to a predetermined input signal applied to the externally accessible terminal of the test mode enable circuit and generating the disable signal responsive to the predetermined signal not being applied to the externally accessible terminal of the test mode enable circuit.

21. The computer system of claim 20 wherein the test mode enable circuit includes a plurality of externally accessible terminals, and wherein the test mode enable circuit comprises a decoder generating the enable signal responsive to a predetermined combination of respective signals applied to the plurality of externally accessible terminals of the test mode enable circuit.

22. A test system for testing a memory device formed on an integrated circuit substrate, the test system comprising:
 a voltage generating circuit formed on the integrated circuit substrate, the voltage generating circuit having a control input and an output terminal coupled to a substrate of the integrated circuit, the voltage generating circuit generating an output voltage at the output terminal that increases in magnitude in one polarity responsive to a control voltage applied to the control input being within a predetermined range;
 a first impedance element coupled between the output terminal and the control input of the voltage generating circuit; and
 an externally accessible input terminal formed in the integrated circuit and coupled to the control input of the voltage generating circuit; and
 a testing device adapted to generate stimulus signals at an output port, to generate a test voltage on a test voltage output terminal, and to receive response signals at an input port, the testing device determining a characteristic of the memory device as a function of the stimulus signals and the response signals, the output port and the input port of the testing device being coupled to the memory device and the test voltage output terminal being coupled to the externally accessible terminal of the integrated circuit.

23. The test system of claim 22 wherein the voltage generating circuit is adapted to generate a negative voltage, and wherein the testing device is adapted to generate at its output terminal a positive voltage, thereby reducing the magnitude of the negative voltage applied to the substrate of the integrated circuit.

24. The test system of claim 22 wherein the externally accessible input terminal is coupled to the control input of the voltage generating circuit through a second impedance element.

25. The test system of claim 22 wherein the voltage generating circuit comprises a charge pump.

26. The test system of claim 22 wherein the voltage generating circuit comprises a voltage generating circuit generating a negative voltage.

27. The test system of claim 22 wherein the voltage generating circuit comprises a voltage generator that is used to bias the substrate to a negative bias voltage during normal operation.

28. The test system of claim 22, further comprising a pass gate positioned between the externally accessible input terminal and the control input of the voltage generating circuit, the pass gate coupling the control input of the voltage generating circuit to the externally accessible input terminal responsive to an enable signal applied to a control input of the pass gate.

29. The test system of claim 28, further comprising a test mode enable circuit having at least one externally accessible terminal and an output terminal coupled to the control terminal of the pass gate, the test mode enable circuit generating the enable signal responsive to a predetermined signal applied to the externally accessible terminal of the test mode enable circuit.

30. The test system of claim 29 wherein the testing device further comprises an enable signal generator coupled to the externally accessible terminal of the test mode enable circuit, the enable signal generator producing the predetermined signal to cause the pass gate to couple the externally accessible terminal of the integrated circuit to the control input of the voltage generating circuit.

31. The test system of claim 29 wherein the test mode enable circuit includes a plurality of externally accessible terminals, and wherein the test mode enable circuit comprises a decoder generating the enable signal responsive to a predetermined combination of respective signals applied to the plurality of externally accessible terminals of the test mode enable circuit.

32. A The test system of claim 31 wherein the testing device further comprises a code generator coupled to the externally accessible input terminals of the test mode enable circuit, the code generator producing the predetermined combination of respective signals to cause the pass gate to couple the externally accessible input terminal of the integrated circuit to the control input of the voltage generating circuit.

33. In an integrated circuit including a voltage generating circuit applying a substrate voltage to a substrate of the integrated circuit that increases in magnitude in one polarity responsive to a control voltage applied to a control input of the voltage generating circuit that is within a predetermined range, a method of biasing the substrate of an integrated circuit to an operating voltage in a normal operating mode and to a test voltage in a test mode, the method comprising:
 coupling the substrate of the integrated circuit and an externally generated control voltage to the control input of the voltage generating circuit in the test mode so that the control voltage applied to the control input of the voltage generating circuit to determine the test voltage is a function of the magnitude of the control voltage and the magnitude of the substrate voltage; and
 coupling only the substrate of the integrated circuit to the control input of the voltage generating circuit in the normal operating mode so that the voltage applied to the control input of the voltage generating circuit to determine the normal operating voltage is a function of the magnitude of the substrate voltage.

34. The method of claim 33 wherein the step of coupling the externally generated control voltage to the control input of the voltage generating circuit comprises coupling the externally generated control voltage to the control input of the voltage generating circuit through an impedance element.

35. The method of claim 33 wherein the step of coupling the substrate to the control input of the voltage generating circuit comprises coupling the substrate to the control input of the voltage generating circuit through an impedance element.

36. The method of claim 33, further comprising coupling the control input of the charge pump to the externally generated control voltage in the test mode and isolating the control input of the charge pump from the externally generated control voltage in the normal operating mode.

37. The method of claim 33 wherein the voltage generating circuit comprises a charge pump.

38. In an integrated circuit including a negative charge pump applying a negative voltage to a substrate of the integrated circuit that becomes more negative responsive to a control voltage applied to a control input of the charge pump that is within a predetermined range, a method of biasing the substrate of an integrated circuit to a negative voltage that is externally adjustable responsive to a positive, externally generated voltage, comprising:

coupling the substrate of the integrated circuit to the control input of the charge pump;

coupling the positive, externally generated voltage to the control input of the charge pump; and adjusting the magnitude of the positive, externally generated voltage thereby adjusting the magnitude of the negative voltage applied to a substrate of the integrated circuit.

39. The method of claim 38 wherein the step of coupling the positive, externally generated voltage to the control input of the charge pump comprises coupling the positive, externally generated voltage to the control input of the charge pump through an impedance element.

40. The method of claim 38 wherein the step of coupling the substrate to the control input of the charge pump comprises coupling the substrate to the control input of the charge pump through an impedance element.

\* \* \* \* \*

UNITED STATES PATENT AND TRADEMARK OFFICE
CERTIFICATE OF CORRECTION

PATENT NO. : 5,905,682
DATED : May 18, 1999
INVENTOR(S) : Gans et al.

It is certified that error appears in the above-identified patent and that said Letters Patent is hereby corrected as shown below:

| | | |
|---|---|---|
| Column 6, line 34 | "a 5 DRAM" | -- a DRAM -- |
| Column 6, line 13 | "A The test" | -- The test -- |

Signed and Sealed this

Twenty-ninth Day of May, 2001

Attest:

NICHOLAS P. GODICI

*Attesting Officer*   *Acting Director of the United States Patent and Trademark Office*